United States Patent
Zhu et al.

(10) Patent No.: US 11,050,417 B2
(45) Date of Patent: Jun. 29, 2021

(54) LOAD-SWITCH GATE-PROTECTION CIRCUIT

(71) Applicant: NXP B.V., Eindhoven (NL)

(72) Inventors: Dongyong Zhu, Shanghai (CN); Feng Cong, Shanghai (CN); FuChun Zhan, Shanghai (CN)

(73) Assignee: NXP B.V., Eindhoven (NL)

( * ) Notice: Subject to any disclaimer, the term of this patent is extended or adjusted under 35 U.S.C. 154(b) by 505 days.

(21) Appl. No.: 15/922,922

(22) Filed: Mar. 16, 2018

(65) Prior Publication Data

US 2019/0149144 A1   May 16, 2019

(30) Foreign Application Priority Data

Nov. 13, 2017 (CN) .......................... 201711111411.8

(51) Int. Cl.
*H02H 9/04* (2006.01)
*H03K 17/082* (2006.01)
*H03K 5/24* (2006.01)

(52) U.S. Cl.
CPC ........... *H03K 17/0822* (2013.01); *H02H 9/04* (2013.01); *H03K 5/24* (2013.01)

(58) Field of Classification Search
USPC .......................... 361/86–87, 91.1, 93.7–93.9
See application file for complete search history.

(56) References Cited

U.S. PATENT DOCUMENTS

| | | | |
|---|---|---|---|
| 4,605,980 A | 8/1986 | Hartranft | |
| 5,909,135 A | 6/1999 | Baldwin et al. | |
| 7,158,359 B2 * | 1/2007 | Bertele | H03K 17/0822 361/93.7 |
| 2008/0186644 A1 * | 8/2008 | Migliavacca | G05F 1/571 361/86 |
| 2010/0284116 A1 * | 11/2010 | Yoshizawa | H02H 9/001 361/91.3 |
| 2012/0236456 A1 * | 9/2012 | Yu | H03K 17/0822 361/91.1 |
| 2014/0002941 A1 * | 1/2014 | James | H02H 3/207 361/91.6 |
| 2014/0043715 A1 * | 2/2014 | Cosgrave | H03G 1/0088 361/90 |
| 2017/0256938 A1 * | 9/2017 | Fukuhara | H02H 9/04 |

FOREIGN PATENT DOCUMENTS

| | | |
|---|---|---|
| EP | 0773588 | 5/1997 |
| EP | 1041634 | 10/2000 |

* cited by examiner

*Primary Examiner* — Danny Nguyen

(57) ABSTRACT

Gate-protection circuitry protects a transistor, such as a MOSFET, from large gate-to-source voltage differentials that can permanently damage the transistor's gate-oxide layer. A source-voltage detector selectively enables the gate-protection circuitry based on a source voltage of the transistor. The gate-protection circuit is implemented without any Zener diodes. The transistor may be a load switch that is selectively controlled to apply a supply voltage to a load.

20 Claims, 3 Drawing Sheets

100

200

300

400

500

LOAD-SWITCH GATE-PROTECTION CIRCUIT

BACKGROUND

The present invention relates generally to digital circuits and, more particularly, to circuitry for protecting transistors, such as MOSFETs used in applications such as load switches, from over-voltage conditions.

FIG. 1 is a schematic circuit diagram of a conventional load-switch circuit 100 including a load-switch driver 110 for controlling the application of a supply voltage Vsupply to a load 120. The load-switch circuit 100 also includes an n-type MOSFET (metal-oxide semiconductor field-effect transistor) MN1 that functions as a controllable load switch between the supply voltage Vsupply and the load 120. The load-switch driver 110 has an input that receives a switch-control signal 108, and an output 112 connected to the gate of the load switch MN1. When MN1 is to be turned on, the switch-control signal 108 is activated to cause the load-switch driver 110 to provide a sufficiently high output voltage at its output 112 to the gate of MN1. When MN1 is to be turned off, the switch-control signal 108 is deactivated to cause the load-switch driver 110 to provide a sufficiently low output voltage at its output 112 to the gate of MN1.

In some applications, it is advantageous to implement the load switch MN1 with a relatively thin gate-oxide layer so that MN1 with a relatively low threshold voltage. For example, in some high-voltage applications, MN1 needs to have an ultra-low turn-on resistance for large loading capacity. The most efficient and easiest way to fabricate such a device is by decreasing the thickness of the gate-oxide layer to achieve a lower threshold voltage. Unfortunately, if the gate-to-source voltage differential Vgs (i.e., the magnitude of the difference between the voltage levels at the gate and source of MN1) becomes too high, for example, when MN1 is initially turned off, then the gate-oxide layer may suffer permanent damage due to electrostatic breakdown. The gate-oxide layer may suffer permanent damage when the gate voltage is sufficiently greater than the source voltage or when the source voltage is sufficiently greater than the gate voltage. To avoid such damage, it is known to add protection circuitry to keep Vgs below MN1's breakdown voltage.

FIG. 2 is a schematic circuit diagram of a conventional load-switch circuit 200 including a load-switch driver 210 and a load switch MN1 for controlling the application of a supply voltage Vsupply to a load 220, where the load-switch circuit 200 also has gate-protection circuitry 230. The load-switch circuit 200 is the same as the load-switch circuit 100 of FIG. 1, except for the addition of the gate-protection circuitry 230. The gate-protection circuitry 230 comprises two Zener diodes Z1 and Z2 connected back-to-back in series between the source and gate terminals of the load switch MN1.

When the load-switch driver 210 is controlled to drive the gate voltage of MN1 high, to turn on the load switch MN1, the source voltage of MN1 also is driven high (i.e., near Vsupply). When MN1 is to be turned off, the load-switch driver 210 is controlled to drive the gate voltage of MN1 low. In certain circumstances, such as when the load 220 is highly capacitive, the source voltage of MN1 can remain relatively high for a relatively long duration. In that case, the Zener diodes Z1 and Z2 limit the gate-to-source voltage differential Vgs of MN1 by preventing the gate voltage from dropping too quickly, which allows time for the source voltage to decrease while maintaining Vgs below the breakdown voltage.

Instead of the two back-to-back Zener diodes Z1 and Z2, other known gate-protection circuits have one of the two Zener diodes and a non-Zener diode (in place of either Z1 or Z2, depending on the particular implementation) configured back-to-back between the gate and source terminals of the load switch.

However, in some integrated circuit (IC) process technologies, Zener diodes require one or more extra mask layers, which increases cost. Furthermore, some IC process design libraries do not even support Zener diodes. Accordingly, it would be advantageous to have a gate-protection circuit that does not require any Zener diodes.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Detailed illustrative embodiments of the invention are disclosed herein. However, specific structural and functional details disclosed herein are merely representative for purposes of describing example embodiments of the invention. The invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention is a load-switch circuit including a main transistor, a turn-on circuit, gate-protection circuitry, and a source voltage detector. The turn-on circuit has an input configured to receive a control signal, and an output connected to the gate of the main transistor. The gate-protection circuitry is connected between the gate and source terminals of the main transistor. The gate-protection circuitry is configured to limit the gate-to-source voltage differential of the main transistor. The source-voltage detector has an input connected to the source of the main transistor, and an output connected to the gate-protection circuitry. The source-voltage detector disables the gate-protection circuitry based on the voltage level at the source of the main transistor.

Figure 3:
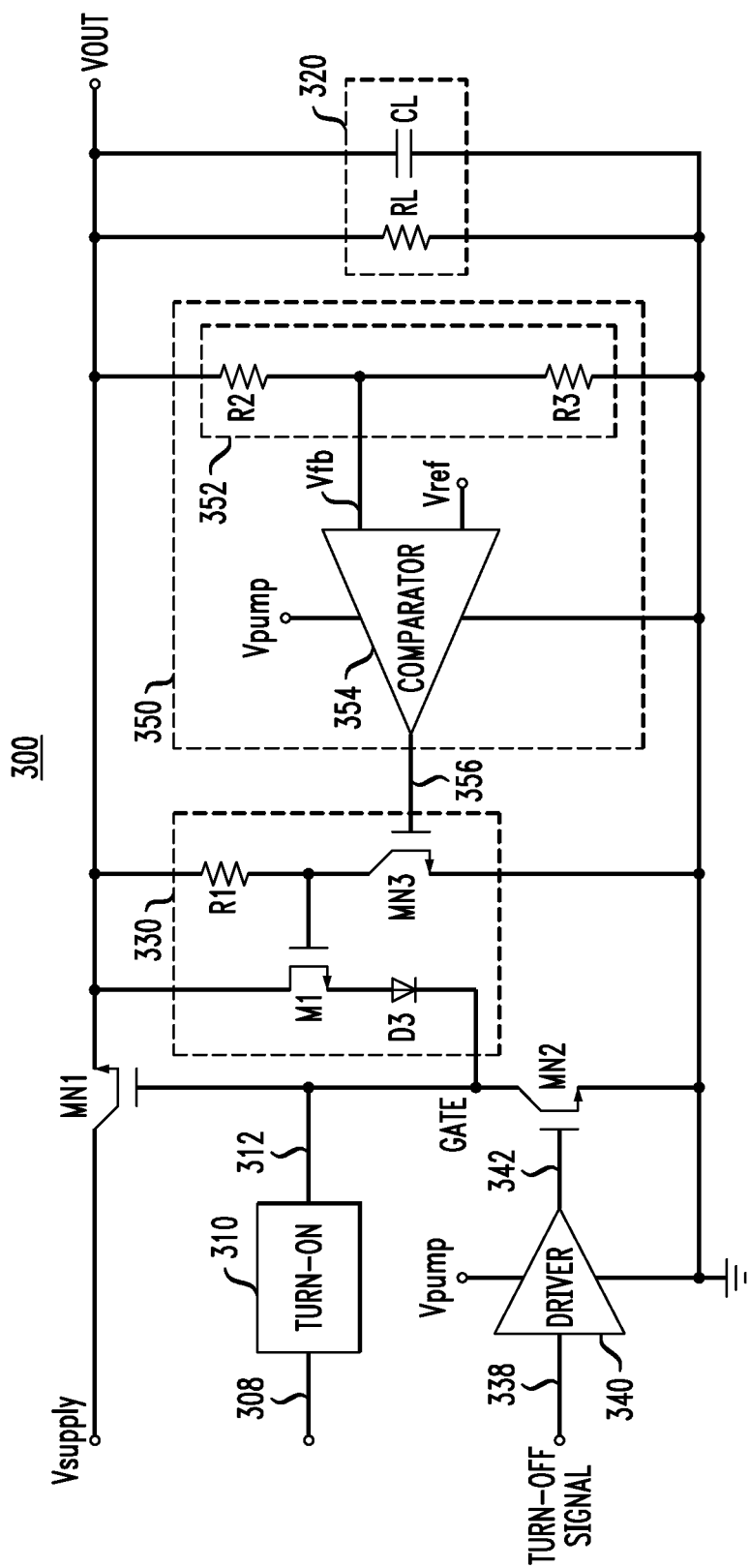
FIG. 3 is a schematic circuit diagram of an embodiment of a load-switch circuit for controlling the application of a supply voltage to a load, where the load-switch circuit has gate-protection circuitry that does not include any Zener diodes.

Referring now to FIG. 3, a schematic circuit diagram of an embodiment of a load-switch circuit 300 including a load switch MN1 and turn-on circuit 310 for controlling the application of a supply voltage Vsupply to a load 320 is shown, where the load 320 has an effective resistance RL and an effective capacitance CL. The load-switch circuit 300 also has gate-protection circuitry 330 that does not include any Zener diodes.

Figure 1:
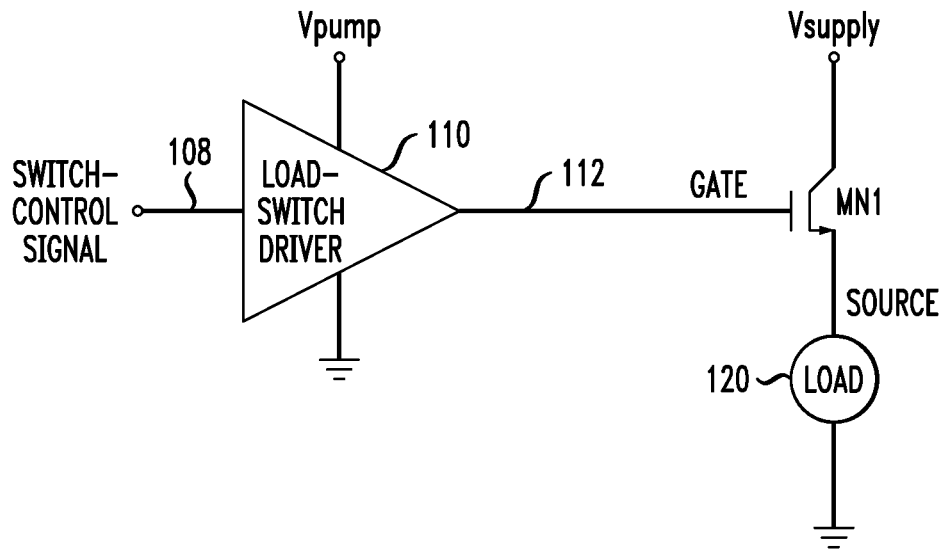
FIG. 1 is a schematic circuit diagram of a conventional load-switch circuit for controlling the application of a supply voltage to a load.
Figure 2:
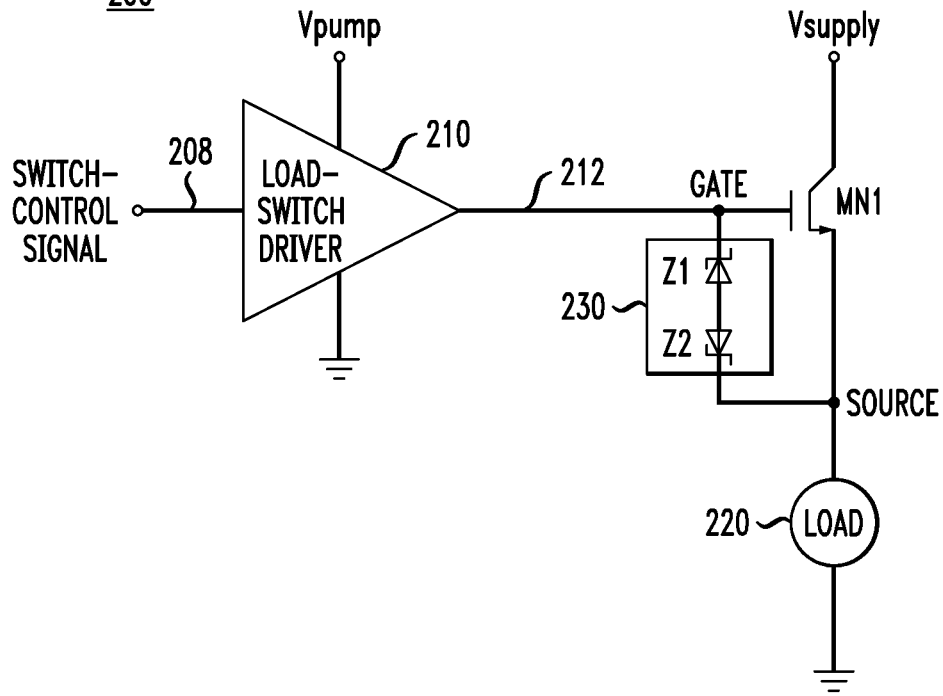
FIG. 2 is a schematic circuit diagram of a conventional load-switch circuit for controlling the application of a supply voltage to a load, where the load-switch circuit has conventional gate-protection circuitry.

The load switch MN1 is controlled by turn-on circuit 310, which selectively applies Vsupply to the load 320. The turn-on circuit 310 can be a MOSFET driver (as in FIGS. 1 and 2), a charge pump, or any other suitable circuitry for selectively controlling the voltage applied to the gate of MN1.

The load-switch circuit 300 also includes a pull-down transistor MN2, which may be a n-type MOSFET, a pull-down driver 340, and a source-voltage detector 350. The gate-protection circuitry 330 includes pull-up transistor M1, which may be a n-type MOSFET, a disabling transistor MN3, which also may be a n-type MOSFET, a resistor R1, and a diode D3. The source-voltage detector 350 includes a voltage divider 352 formed by resistors R2 and R3, and a comparator 354.

Before the load switch MN1 is first turned on, (i) a switch-control signal 308 applied to the turn-on circuit 310 ensures that an output voltage 312 applied to the gate of MN1 is low so that MN1 is off, (ii) a pull-down control signal 338 (i.e., the Turn-Off signal) applied to the pull-down driver 340 ensures that an output voltage 342 of the pull-down driver 340, which is applied to the gate of the pull-down transistor MN2, is high so that MN2 is on to ensure that the gate of MN1 is low, and (iii) an output voltage VOUT is low (e.g., ground level) so that a feedback voltage Vfb generated by the voltage divider 352 is less than a reference voltage Vref such that an output voltage 356 of the pull-down driver (i.e., the comparator 354) is high and a disabling transistor MN3 is on. With VOUT low and MN3 on, the gate of pull-up transistor M1 will be low such that M1 is off. Note that the turn-on circuit 310 may have its own discharge circuit that ensures that the turn-on circuit output voltage 312 is low.

When the load switch MN1 is to be turned on, a switch-control signal 308 is provided to the turn-on circuit 310 to apply a sufficiently high output voltage 312 to the gate terminal of MN1 to turn MN1 on. The pull-down control signal 338 applied to the pull-down driver 340 keeps a sufficiently low output voltage 342 applied to the gate terminal of the pull-down transistor MN2 to keep MN2 off.

With the load switch MN1 turned on, the output voltage VOUT rises towards Vsupply and, as a result, the feedback voltage Vfb also rises. The resistances of R2 and R3 are selected such that, at an appropriate voltage level as VOUT approaches Vsupply, the feedback voltage Vfb exceeds the reference voltage Vref, which causes the comparator 354 to drive its output voltage 356 low, thereby turning off the disabling transistor MN3. With MN3 off and VOUT rising, the voltage at the gate of the pull-up transistor M1 also will rise, thereby turning M1 on.

With the load switch MN1 on, the steady-state condition of the load-switch circuit 300 will have the pull-down transistor MN2 and the disabling transistor MN3 off. The state of the pull-up transistor M1 will depend on the output voltage VOUT. If the output voltage VOUT is sufficiently high, then M1 will be on. If the output voltage VOUT is sufficiently low, then M1 will be off.

When the load switch MN1 is to be turned off, the switch-control signal 308 is applied to cause the turn-on circuit 310 to apply a sufficiently low output voltage 312 to the gate terminal of the load switch MN1. At the same time, an appropriate pull-down control signal 338 is applied to cause the pull-down driver 340 to apply a sufficiently high output voltage 342 to the gate terminal of the pull-down transistor MN2 to turn MN2 on in order to help drain the gate terminal of MN1 toward ground.

With the load 320 having a sufficiently large capacitance CL, the output voltage VOUT will decrease slowly towards ground. With the pull-up transistor M1 still on, the combination of M1 and the diode D3 prevents the voltage level at the gate of the load switch MN1 from dropping too quickly, thereby clamping MN1's gate-to-source voltage differential Vgs below MN1's breakdown voltage and thereby preventing permanent damage to MN1's gate-oxide layer.

As the output voltage VOUT continues to drop, at a certain voltage level, the feedback voltage Vfb will drop below the reference voltage Vref and the comparator 354 will again drive its output voltage 356 high, thereby turning the disabling transistor MN3 back on, which will drive the gate terminal of the pull-up transistor M1 low, thereby turning off M1 and disabling the gate-protection circuitry 330 by isolating VOUT from MN1's gate terminal to avoid a possible reverse-leakage path. The level of the output voltage VOUT at which this occurs is designed (by appropriately selecting the resistances of R2 and R3) to ensure that MN1's Vgs will be below MN1's breakdown voltage.

With the load switch MN1 off, the steady-state condition of the load-switch circuit 300 will again have the pull-up transistor M1 off, and the pull-down transistor MN2 and the disabling transistor MN3 on.

Although the load-switch circuit 300 has been described as having the pull-down transistor MN2 and the pull-down driver 340, those skilled in the art will understand that they are optional components of load-switch circuits of the present invention.

Note that the locations of the pull-up transistor M1 and the diode D3 can be swapped, such that D3's cathode is connected to M1's drain terminal. In that case, since MN1's gate voltage can be higher than VOUT, care must be taken about the safety of M1's gate-oxide layer due to large voltage differentials between M1's gate and M1's source.

In some alternative implementations, one or more of the transistors can be implemented using p-type devices instead of n-type devices as long as any necessary corresponding changes are also made to the design.

Figure 4:
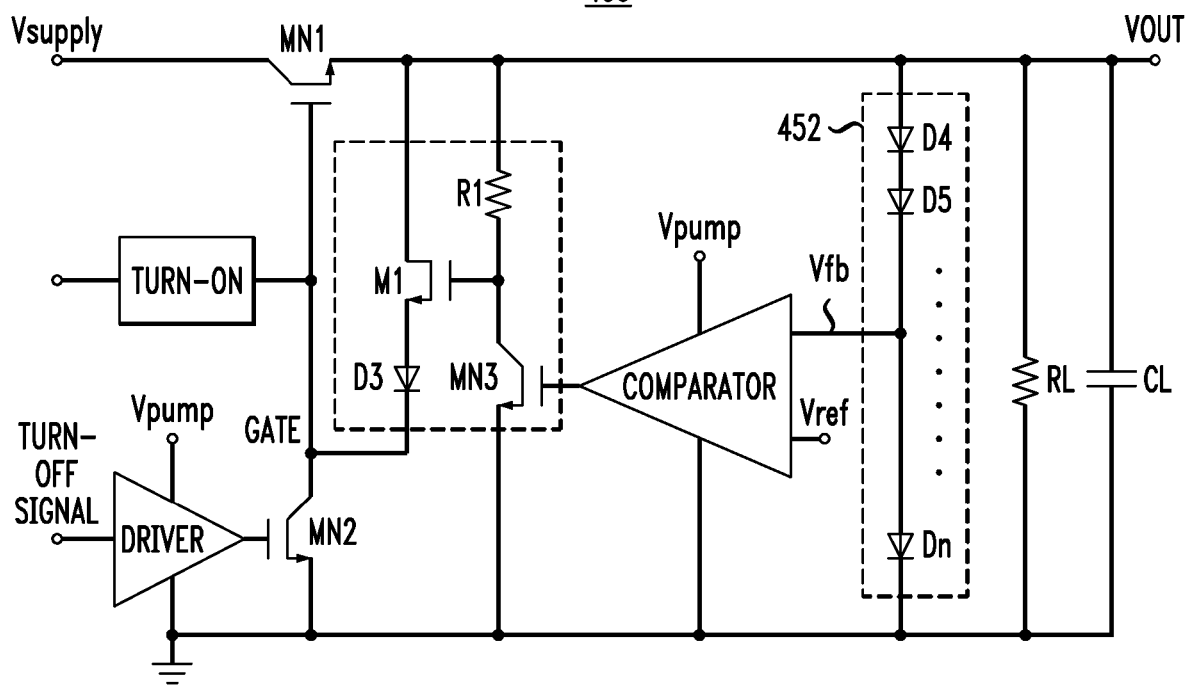
FIGS. 4 and 5 are schematic circuit diagrams of alternative embodiments of load-switch circuits for controlling the application of a supply voltage Vsupply to a load, where each load-switch circuit has gate-protection circuitry that does not include any Zener diodes.

FIG. 4 is a schematic circuit diagram of an alternative embodiment of a load-switch circuit 400 for controlling the application of a supply voltage Vsupply to a load. The load-switch circuit 400 has gate-protection circuitry that does not include any Zener diodes. The load-switch circuit 400 is identical to the load-switch circuit 300 of FIG. 3, except that, instead of the resistor-based voltage divider 352 of FIG. 3, the feedback voltage Vfb is generated by a voltage divider 452 implemented using a number of diodes D4, D5, . . . , Dn connected in series (front-to-back) between VOUT and ground. Those skilled in the art will understand that there are other ways of generating the feedback voltage Vfb, including, without limitation, diode-connected transistors.

Figure 5:
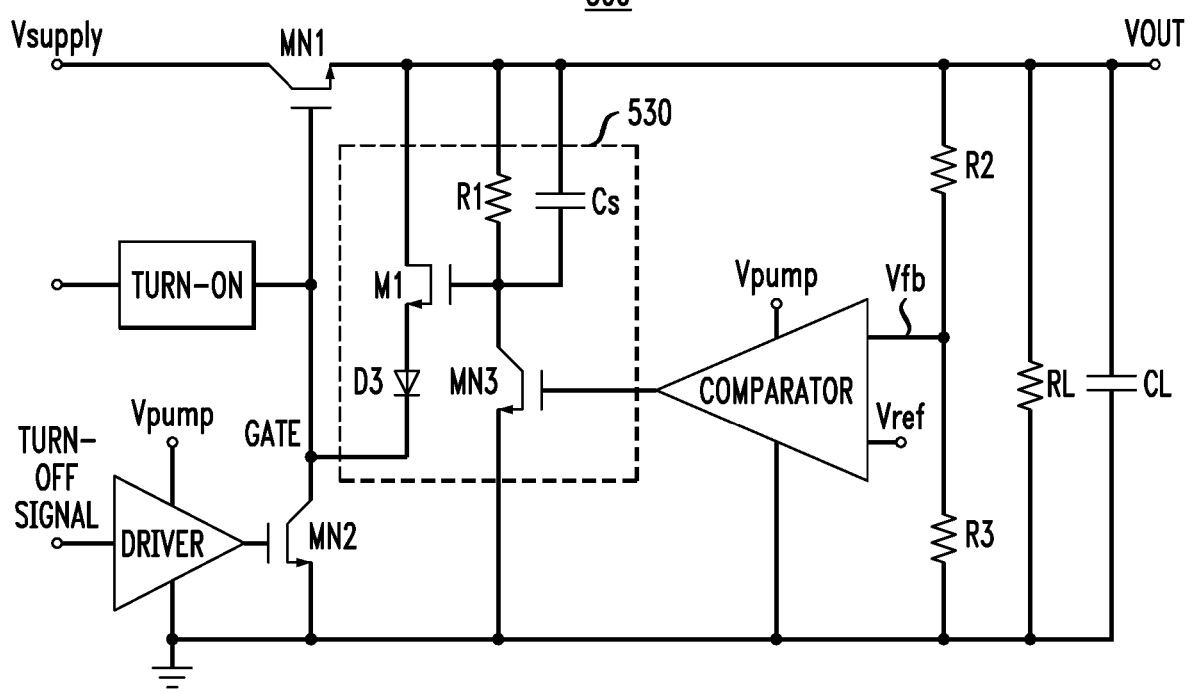

FIG. 5 is a schematic circuit diagram of another embodiment of a load-switch circuit 500 for controlling the application of a supply voltage Vsupply to a load. The load-switch circuit 500 has gate-protection circuitry 530 that does not include any Zener diodes. The load-switch circuit 500 is identical to the load-switch circuit 300 of FIG. 3, except that the gate-protection circuitry 530 also includes a stabilizing capacitance Cs between VOUT, the gate of the pull-up transistor M1, and a mode between resistor R1 and the drain of MN3.

When the load switch MN1 is turned off in the load-switch circuit 500, the stabilizing capacitance Cs helps to stabilize the gate terminal of the pull-up transistor M1 close to the output voltage level VOUT, thereby helping to keep M1 turned completely on in order to keep the voltage level at MN1's gate terminal sufficiently close to the voltage level at MN1's source terminal. This is especially helpful for circuits having large load capacitances CL.

Although the invention has been described in the context of protecting MOSFETs used as load switches, those skilled in the art will understand that the invention can be implemented to protect MOSFETs used in applications other than load switches as well as other types of transistors in the same or other applications. For other applications, the transistor drain can be, but does not have to be connected to a power supply and/or the transistor source can be, but does not have to be connected to a load. The pull-up, pull-down, and disabling transistors preferably are n-type devices, and the main transistor is a MOSFET.

Unless explicitly stated otherwise, each numerical value and range should be interpreted as being approximate as if the word "about" or "approximately" preceded the value or range.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding terminals, nodes, ports, or paths may be referred to by the same name and are interchangeable for purposes here.

As used in this specification and claims, the term "channel node" refers generically to either the source or drain of a MOS transistor (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer respectively either to the source, drain, and gate of a MOSFET or to the emitter, collector, and base of a bi-polar device if an embodiment of the invention is implemented using bi-polar transistor technology. Further, the terms "source," "drain," and "gate" are used interchangeably with the terms "source terminal," "drain terminal," and "gate terminal."

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. A load-switch circuit, comprising:
a main transistor having a gate terminal, a drain terminal, and a source terminal;
a turn-on circuit having an input configured to receive a control signal and an output connected to the gate terminal of the main transistor;
gate-protection circuitry connected between the gate and source terminals of the main transistor, wherein the gate-protection circuitry limits the gate-to-source voltage differential of the main transistor; and
a source-voltage detector having an input connected to the source terminal of the main transistor and an output connected to the gate-protection circuitry,
wherein the source-voltage detector disables the gate-protection circuitry based on a voltage level at the source terminal of the main transistor;
wherein the gate-protection circuitry comprises:
a pull-up transistor having a drain terminal connected to the source terminal of the main transistor;
a diode connected between a source terminal of the pull-up transistor and the gate terminal of the main transistor;
a disabling transistor having a gate terminal connected to the output of the source-voltage detector, a source terminal connected to ground, and a drain terminal connected to a gate terminal of the pull-up transistor; and
a first resistor connected between the source terminal of the main transistor and a node between the gate terminal of the pull-up transistor and the drain terminal of the disabling transistor.

2. The load-switch circuit of claim 1, further comprising:
a pull-down transistor having a drain connected to the gate terminal of the main transistor, a source terminal connected to ground, and a gate terminal; and
a pull-down driver having an input configured to receive a pull-down control signal and an output connected to the gate terminal of the pull-down transistor,
wherein the pull-down driver controls the pull-down transistor based on the pull-down control signal.

3. The load-switch circuit of claim 2,
wherein the pulldown transistor is an n-type device.

4. The load-switch circuit of claim 1,
wherein the gate-protection circuitry further comprises a stabilizing capacitance connected in parallel with the first resistor between the source terminal of the main transistor and the gate terminal of the pull-up transistor.

5. The load-switch circuit of claim 1,
wherein the source-voltage detector comprises a comparator configured to compare a reference voltage to a feedback voltage based on the voltage level at the source terminal of the main transistor.

6. The load-switch circuit of claim 5,
wherein the source-voltage detector further comprises a voltage divider connected between the source terminal of the main transistor and ground and configured to generate the feedback voltage.

7. The load-switch circuit of claim 6,
wherein the voltage divider comprises at least two resistors connected in series.

8. The load-switch circuit of claim 6,
wherein the voltage divider comprises at least two diodes connected in series.

9. The load-switch circuit of claim 1,
wherein:
the drain terminal of the pull-up transistor is connected to the source terminal of the main transistor;
the source terminal of the pull-up transistor is connected to the anode of the diode; and
the cathode of the diode is connected to the gate terminal of the main transistor.

10. The load-switch circuit of claim 1,
wherein the pullup transistor and the disabling transistor are n-type devices.

11. The load-switch circuit of claim 1,
wherein the gate-protection circuitry is implemented without any Zener diodes.

12. The load-switch circuit of claim 1, wherein the main transistor is a MOSFET transistor.

13. The load-switch circuit of claim 12,
wherein: the MOSFET transistor is a load switch having its drain terminal configured to be connected to a power supply and its source terminal configured to be connected to a load; and
the load-switch circuit further comprises:
an n-type pull-down transistor having a drain connected to the gate terminal of the load switch, a source terminal connected to ground, and a gate terminal; and
a pull-down driver having an input configured to receive a pull-down control signal and an output connected to the gate terminal of the pull-down transistor,
wherein: the pull-down driver is configured to control the pull-down transistor based on the pull-down control signal such that the pull-down driver turns on the pull-down transistor when the pull-down control signal indicates that the load switch is being turned off;
the gate-protection circuitry comprises:
a pull-up transistor having a gate terminal and connected in series to a diode between the source terminal of the load switch and the gate terminal of the load switch; and
a disabling transistor having a gate terminal connected to the output of the source-voltage detector,
wherein the pull-down transistor is connected in series with a first resistor at the gate terminal of the pull-up transistor;

the source-voltage detector comprises:
a comparator configured to compare a reference voltage to a feedback voltage based on the voltage level at the source terminal of the load switch; and
a voltage divider connected between the source terminal of the load switch and ground and configured to generate the feedback voltage;
the drain terminal of the pull-up transistor is connected to the source terminal of the load switch;
the source terminal of the pull-up transistor is connected to the anode of the diode;
the cathode of the diode is connected to the gate terminal of the load switch;
the pull-up transistor and the disabling transistor are n-type devices; and the gate-protection circuitry is implemented without any Zener diodes.

14. The load-switch circuit of claim 13,
wherein the gate-protection circuitry further comprises a stabilizing capacitance connected in parallel with the first resistor between the source terminal of the load switch and the gate terminal of the pull-up transistor.

15. The load-switch circuit of claim 13,
wherein the voltage divider comprises resistors connected in series.

16. The load-switch circuit of claim 13,
wherein the voltage divider comprises diodes connected in series.

17. A load-switch circuit, comprising:
a main transistor having a gate terminal, a drain terminal, and a source terminal;
a turn-on circuit having an input configured to receive a control signal and an output connected to the gate terminal of the main transistor;
gate-protection circuitry connected between the gate and source terminals of the main transistor, wherein the gate-protection circuitry limits the gate-to-source voltage differential of the main transistor; and
a source-voltage detector having an input connected to the source terminal of the main transistor and an output connected to the gate-protection circuitry,
wherein the source-voltage detector disables the gate-protection circuitry based on a voltage level at the source terminal of the main transistor;
a pull-down transistor having a drain connected to the gate terminal of the main transistor, a source terminal connected to ground, and a gate terminal; and
a pull-down driver having an input configured to receive a pull-down control signal and an output connected to the gate terminal of the pull-down transistor;
wherein the pull-down driver controls the pull-down transistor based on the pull-down control signal.

18. The load-switch circuit of claim 17,
wherein the source-voltage detector comprises a comparator configured to compare a reference voltage to a feedback voltage based on the voltage level at the source terminal of the main transistor.

19. The load-switch circuit of claim 18,
wherein the source-voltage detector further comprises a voltage divider connected between the source terminal of the main transistor and ground and configured to generate the feedback voltage.

20. The load-switch circuit of claim 17,
wherein the main transistor is a MOSFET transistor.

\* \* \* \* \*